(12) United States Patent
Matera et al.

(10) Patent No.: US 8,500,928 B2
(45) Date of Patent: Aug. 6, 2013

(54) SPUTTER TARGETS AND METHODS OF FORMING SAME BY ROTARY AXIAL FORGING

(75) Inventors: John P. Matera, Grove City, OK (US); Robert B. Ford, Washington Court House, OH (US); Charles E. Wickersham, Jr., Columbus, OH (US)

(73) Assignee: Global Advanced Metals, USA, Inc., Waltham, MA (US)

(*) Notice: Subject to any disclaimer, the term of this patent is extended or adjusted under 35 U.S.C. 154(b) by 0 days.

(21) Appl. No.: 13/551,697

(22) Filed: Jul. 18, 2012

(65) Prior Publication Data
US 2012/0297855 A1 Nov. 29, 2012

Related U.S. Application Data

(62) Division of application No. 11/121,440, filed on May 4, 2005, now Pat. No. 8,252,126.

(60) Provisional application No. 60/568,592, filed on May 6, 2004.

(51) Int. Cl.
*C22F 1/18* (2006.01)
*C22F 1/04* (2006.01)
*C22F 1/14* (2006.01)
*C22F 1/08* (2006.01)
*C22C 14/00* (2006.01)
*C22C 27/02* (2006.01)
*C22C 9/00* (2006.01)
*C22C 21/00* (2006.01)

(52) U.S. Cl.
USPC ........... 148/668; 148/421; 148/422; 148/432; 148/437; 148/688; 148/678; 148/679

(58) Field of Classification Search
None
See application file for complete search history.

(56) References Cited

U.S. PATENT DOCUMENTS

| | | | |
|---|---|---|---|
| 3,573,185 A | 3/1971 | Jennings et al. | |
| 4,121,438 A | 10/1978 | McCullough | 64/31 |
| 4,313,332 A | 2/1982 | Penny et al. | 72/406 |
| 4,698,992 A | 10/1987 | Bernet | 72/67 |
| 4,795,333 A | 1/1989 | Standring | 425/78 |
| 4,851,193 A | 7/1989 | Mahajan et al. | |
| 5,171,379 A | 12/1992 | Kumar et al. | |
| 5,531,088 A | 7/1996 | Inatani | 72/84 |
| 5,590,389 A | 12/1996 | Dunlop et al. | |
| 5,592,847 A | 1/1997 | Sarkisian et al. | 72/356 |
| 6,240,765 B1 | 6/2001 | Delgado et al. | 72/356 |
| 6,331,233 B1 | 12/2001 | Turner | |

(Continued)

FOREIGN PATENT DOCUMENTS

| | | |
|---|---|---|
| CN | 1449452 A | 10/2003 |
| JP | 59-42910 A | 3/1984 |

(Continued)

OTHER PUBLICATIONS

Chou et al., "Rotary Forging—A Precession Process," *Mechanical Engineering*, Mar. 1985, pp. 73-77.

(Continued)

*Primary Examiner* — Jessee R. Roe
(74) *Attorney, Agent, or Firm* — Kilyk & Bowersox, P.L.L.C.

(57) ABSTRACT

A method of making sputter targets using rotary axial forging is described. Other thermomechanical working steps can be used prior to and/or after the forging step. Sputter targets are further described which can have unique grain size and/or crystal structures.

30 Claims, 6 Drawing Sheets

U.S. PATENT DOCUMENTS

| | | | |
|---|---|---|---|
| 6,348,139 B1 | 2/2002 | Shah et al. | |
| 6,462,339 B1 | 10/2002 | Michaluk et al. | |
| 6,539,765 B2 | 4/2003 | Gates | 72/69 |
| 2003/0037847 A1 | 2/2003 | Michaluk et al. | |
| 2003/0056619 A1 | 3/2003 | Kumar et al. | |
| 2005/0155677 A1 | 7/2005 | Wickersham | |

FOREIGN PATENT DOCUMENTS

| | | |
|---|---|---|
| JP | 05-285586 | 11/1993 |
| JP | 2000-144210 | 5/2000 |
| WO | 00/31310 | 6/2000 |
| WO | WO 01/96620 A2 | 12/2001 |

OTHER PUBLICATIONS

Maicki, "Orbital Forging," *Metallurgia and Metal Forming*, Jun. 1977, pp. 265-269.

Kubo et al., "Deformation Characteristics of Cylindrical Billet in Upsetting by a Rotary Forging Machine," *1st International Conference on Rotary Metal-Working Processes*, London, UK, Nov. 20-22, 1979, pp. 99-112.

Little et al., "Load-Deformation Relationships During Upsetting by Rotary Forging," *1st International Conference on Rotary Metal-Working Processes*, London, UK, Nov. 20-22, 1979, pp. 125-137.

Li et al., "Recent development and applications of three-dimensional finite element modeling in bulk forming processes," *Journal of Materials Processing Technology*, vol. 113, pp. 40-45, 2001.

Standring et al., "Metallurgical Aspects of Rotary Metal Forming," *1st International Conference on Rotary Metal-Working Processes*, London, UK, Nov. 20-22, 1979, pp. 157-171.

Faccini, "Orbital Forging of Heavy Metal EFP Liners," The Minerals, Metals & Materials Society, pp. 111-143, 1992.

"The Push Toward Orbital Forging," American Machinist, Nov. 1982, pp. 142-144.

Shivpuri, "Past Developments and Future Trends in the Rotary or Orbital Forging Process," J. Materials Shaping Technology, vol. 6, No. 1, pp. 55-71, 1988.

International Search Report and Written Opinion from PCT/US2005/015839 issued Sep. 19, 2005.

Fonte, V., "Flowforming of thin-walled tubes and cylinders," Sep. 1997, Tube International, vol. 16 (80, pp. 389-392.

Fonte, V., "Flowforming of metal shapes," Sep. 1995, Fabricator, vol. 25 (7), pp. 50-51.

Office Action from the corresponding Chinese Patent Application No. 200580022954.1, believed to be dated Jan. 3, 2009, six pages.

English translation of Japanese Office Action dated May 31, 2011, (4 pages), issued in Japanese Patent Application No. 2007-511634.

English translation of Japanese Office Action dated Dec. 20, 2011, (4 pages), issued in Japanese Patent Application No. 2007-511634.

English translation of Japanese Office Action dated Aug. 14, 2012, (8 pages), issued in Japanese Patent Application No. 2007-511634.

Finished target blank ready for final machining/ bonding

Finished Configuration ready for Final Machining

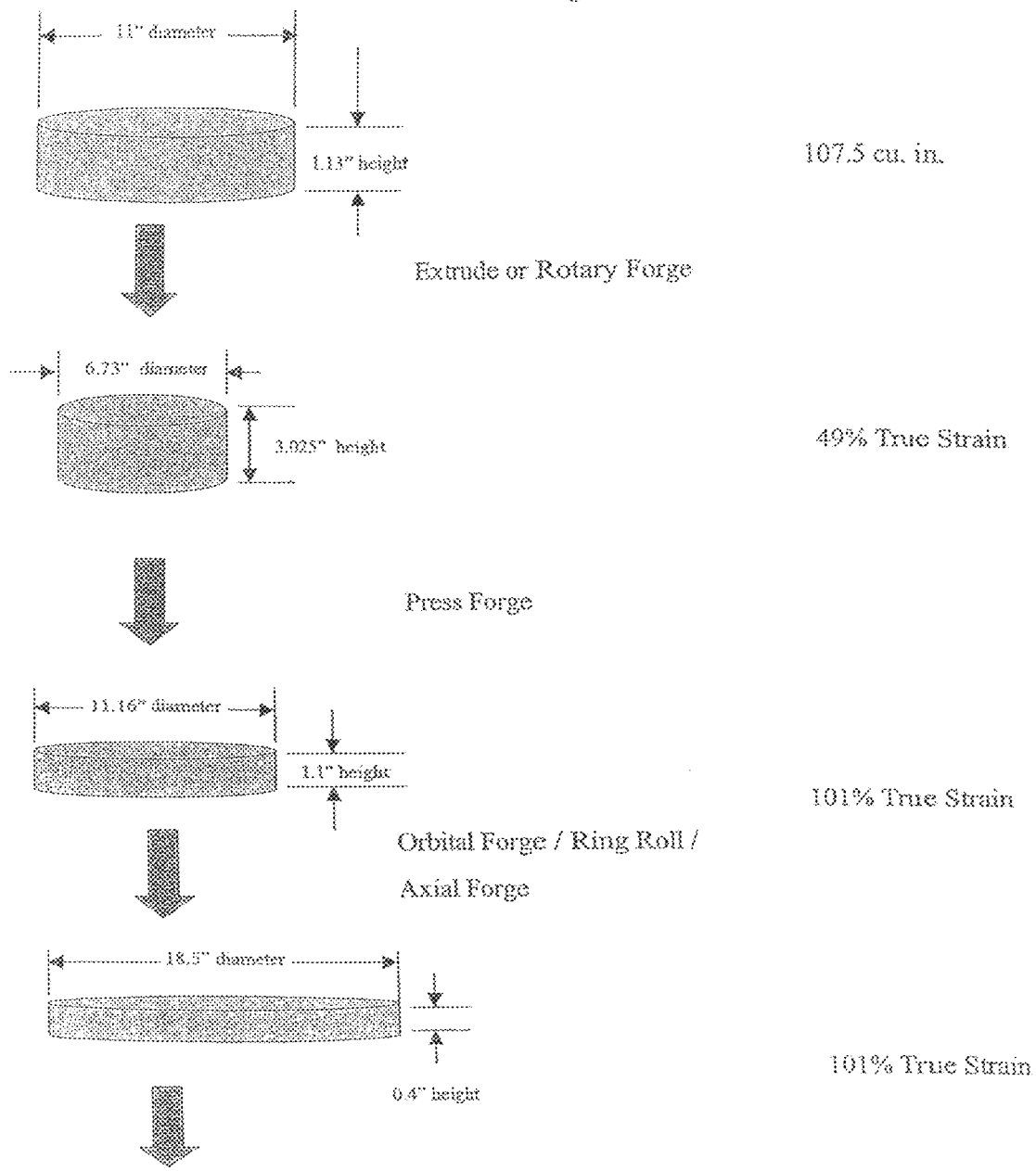

Figure 4. EBSD Map showing grain size and crystallographic texture of orbitally forged tantalum sputtering target cross-section.
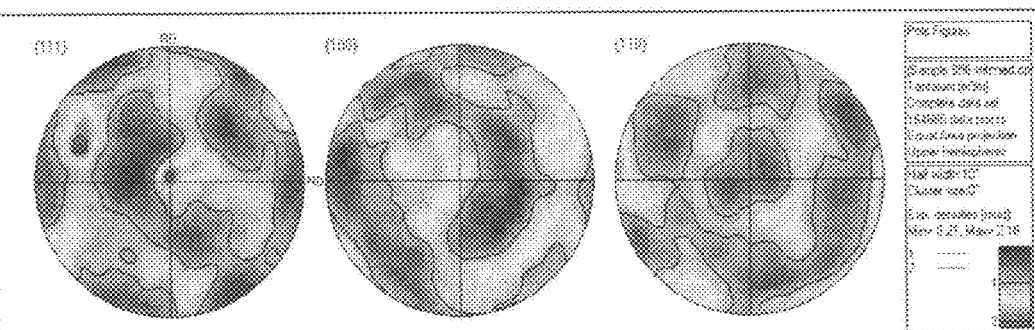
Figure 5. EBSD Pole figures for orbitally forged tantalum sputtering target.

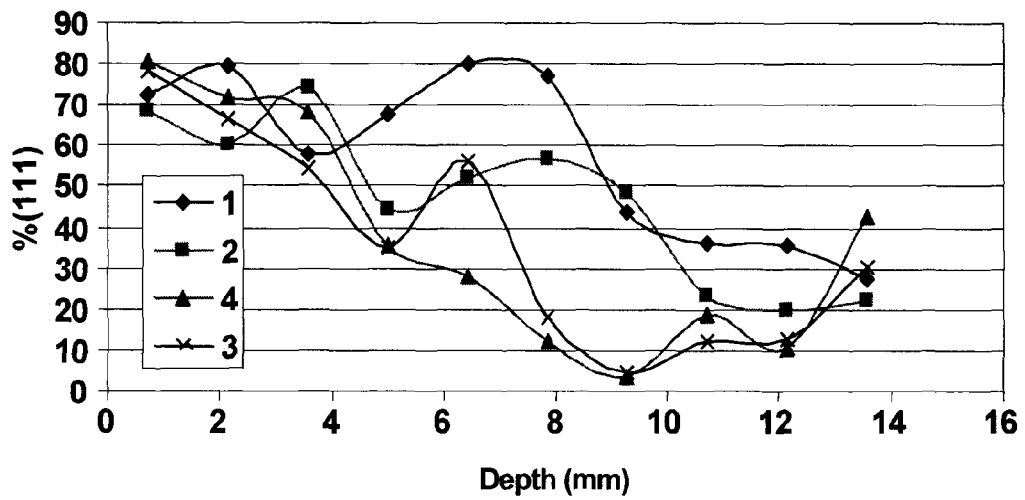
Figure 6. % (111) texture gradient in four different orbital forged tantalum samples.
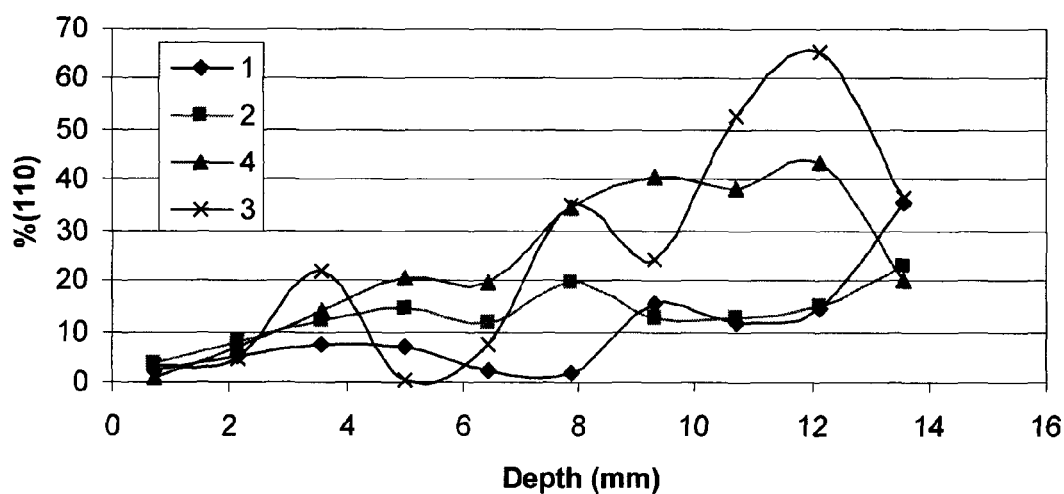
Figure 7. % (110) texture gradient in tantalum produced by orbital forging.

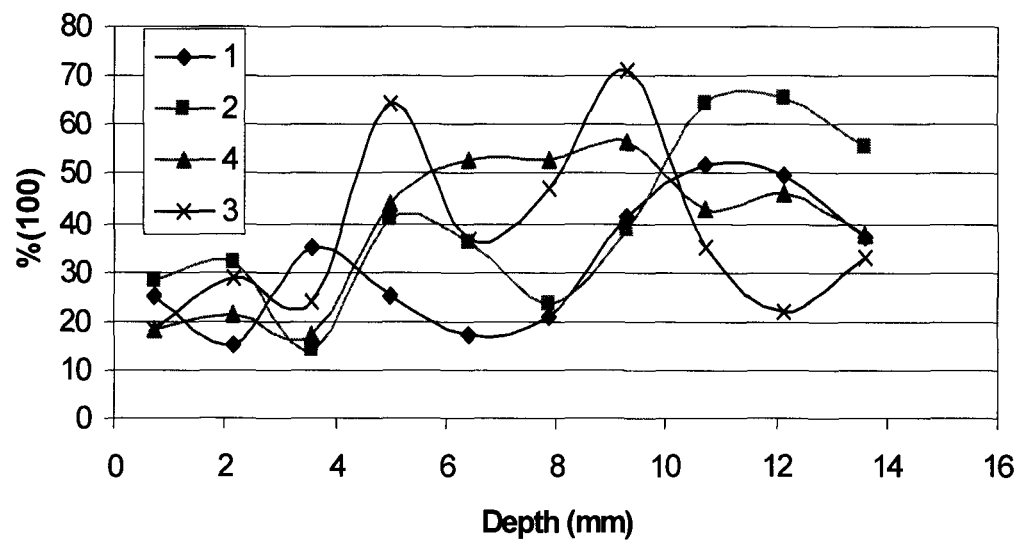
Figure 8. % (100) texture gradient for orbital forged tantalum.
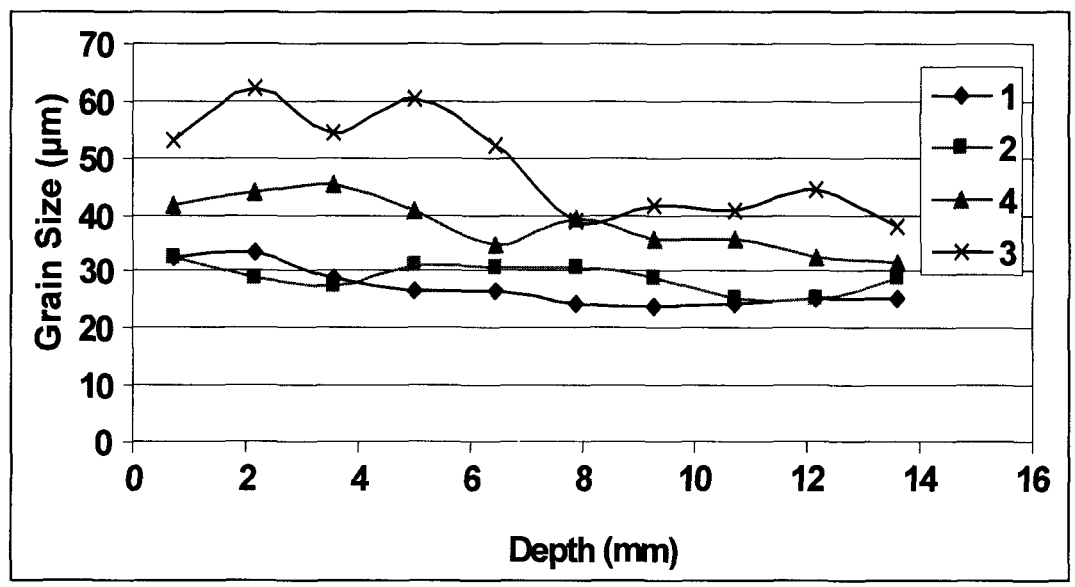
Figure 9

SPUTTER TARGETS AND METHODS OF FORMING SAME BY ROTARY AXIAL FORGING

This application is a divisional of U.S. patent application Ser. No. 11/121,440, filed May 4, 2005, now U.S. Pat. No. 8,252,126, which in turn claims the benefit under 35 U.S.C. §119(e) of prior U.S. Provisional Patent Application No. 60/568,592 filed May 6, 2004, which is incorporated in its entirety by reference herein.

BACKGROUND OF THE INVENTION

The present invention relates to sputter targets and components used for sputtering. More particularly, the present invention relates to methods of forming sputtering targets as well as the sputtering targets resulting from the methods of the present invention.

There are a variety of ways to make sputtering targets from metals which generally involves taking a powder metallurgy product or a ingot-derived product which is generally in the shape of a billet and subsequently working the billet into the shape of the desired sputter target which many times is planar and circular. The means generally used to work a billet into the desired shape are various methods of forging which are rolling, hammer milling, extruding, upset forging, and the like. Generally, these methods are work intensive in that they take large amounts of time to work the material since these forging or milling operations are very labor intensive and take a great amount of time due to the necessary deformation that is involved. Furthermore, by using these type of forging or milling steps, a sputter target which is formed, generally requires large amounts of machining in order to obtain the desired close tolerances and good surface finish. In addition, the circular shape of the planar target is generally not exact and has a large variance, such as a variance of 10 to 15%, with respect to the variation in diameter around the target.

Thus, there is a need in the industry to overcome these disadvantages and provide a lower cost method to form sputter targets as well as provide a means to reduce the time necessary to form targets.

SUMMARY OF THE PRESENT INVENTION

A feature of the present invention is to provide a method to produce sputter targets at a lower cost and with less labor intensive operations.

A further feature of the present invention is to provide a method to make sputter targets which require less time during the formation process.

An additional feature of the present invention is to provide a method that provides a more consistent sputter target with respect to grain size and/or crystal orientation.

An additional feature of the present invention is to provide a sputter target that has less variation in diameter around the target.

In addition, another feature of the present invention is to provide a sputter target which, after formation, requires reduced machining.

A further feature of the present invention is to provide a sputter target that has a transitional primary texture or a controlled texture gradient.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of forming a sputter target. The method involves rotary axial forging of an ingot derived preform to a shape and size of a sputter target. The rotary axial forging is preferably achieved in a closed die.

The present invention further relates to a sputter target having a grain size pattern that is a continuous radial-circumferential pattern around the center of the sputter target.

Furthermore, the present invention relates to a sputter target having a crystal structure pattern that is a continuous radial-circumferential pattern around the center of the target.

Also, the present invention relates to a sputter target having a variation in diameter of no more than 5% around the sputter target.

In addition, the present invention relates to a sputter target having a transitional primary texture or controlled texture gradient.

It is to be understood that both the foregoing general description and the following detailed description are exemplary and explanatory only and are intended to provide a further explanation of the present invention, as claimed.

The accompanying drawings, which are incorporated in and constitute a part of this application, illustrate several embodiments of the present invention and together with this description, serve to explain the principles of the present invention.

BRIEF DESCRIPTION OF THE DRAWINGS

FIG. 3 is a flow diagram of side views of the sequential process of forming a sputtering target using one embodiment of the present invention.

FIG. 4 is an EBSD cross-section showing the grain structure and orientation of a rotary axial forged tantalum sputtering target material.

FIG. 5 is an EBSD derived pole figure from a rotary axial forged tantalum sputtering target material.

FIGS. 6-8 are graphs showing texture gradients for % (111), % (110), and % (100) respectively, through the thickness of the samples.

FIG. 9 is a graph showing the average grain size through the thickness of the samples.

DETAILED DESCRIPTION OF THE PRESENT INVENTION

Figure 1A:
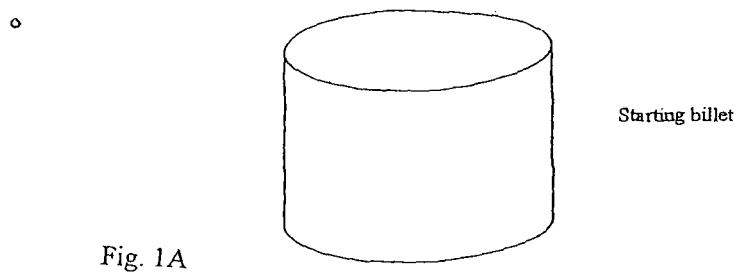
FIGS. 1 (A)-(C) are side exploded views of the general working of a billet into a sputter target by rotary axial forging.

The present invention relates to sputter targets and methods of making sputter targets preferably using a rotary axial forging technique as part of the method of forming the sputter target.

In more detail, in the process, a sputter target can be formed by rotary axial forging of an ingot derived preform or work piece to the shape and size of the desired sputter target.

For purposes of the present invention, the ingot derived preform work piece can be any ingot derived material that can be reduced in size (e.g., deformation) to the shape of the desired sputter target. Thus, the ingot derived preform is a material that generally has a greater height than the desired sputtering target and a lesser diameter than the sputter target. The ingot derived preform can generally be any desired height and/or diameter or other dimensional shape as long as it can be shaped or deformed or worked to the desired shape of the final sputter target dimensions. For purposes of the present invention, preferably, the ingot derived preform is cylindrical in shape and can be, for instance, a billet, a rod, a cylinder, or other similar shape. The ingot derived preform can have other geometrical shapes such as a rectangle. However, starting with this type of preform shape generally results in taking the rectangular shape and forming it into a cylindrical shape by forging techniques known to those skilled in the art. As an example, a billet having a diameter from about 3 inches to about 14 inches can be used. Generally, the height of the billet is preferably no more than about 2 times and more preferably no more than 1.8 times the diameter of the billet or other preform or other work piece. Larger height/diameter ratios can be used.

The billet or other work piece can be formed, for instance, following the methods and techniques described in U.S. Pat. No. 6,348,113 to Michaluk et al., incorporated in its entirety by reference herein.

With respect to the ingot derived preform, the preform can have any purity, any grain size, and/or any texture. Preferably, the ingot derived preform has a purity of greater than 95% with respect to the primary metal present and more preferably a purity of 99%, 99.5%, 99.9%, 99.95%, 99.99%, 99.995%, 99.999%, or greater with respect to the purity of the primary metal present. With respect to the metal, any metal can be used as long as it can be sputtered. BCC-type or FCC-type metals or alloys thereof can be used. Examples include, but are not limited to, refractory metals, valve metals, as well as other types of metals. Specific examples include, but are not limited to, tantalum, niobium, titanium, cobalt, copper, aluminum, gold, silver, nickel, platinum, hafnium, zirconium, paladium, vanadium, iridium, molybdenum, tungsten, iron and alloys thereof, and the like.

As stated, the ingot derived preform can have any average grain size. Examples of average grain sizes include 1,000 microns or less and more preferably 500 microns or less. Other ranges include, but are not limited to, 250 microns or less, 150 microns or less, 100 microns or less, 75 microns or less, 50 microns or less, 25 microns or less, 10 microns or less, and any other numerical ranges from about 1 micron to about 1,000 microns. With respect to the texture, any crystal orientation can be used in the present invention. Examples include, but are not limited to, primary textures and mixed textures. For instance, the texture can be, for cubic metals, a (111) texture (or crystal orientation), a (100) texture, a (110) texture, or a mixture of these textures. Similarly, for hexagonal metals such as titanium, the texture can be (0002) texture, (10$\bar{1}$2) texture, (10$\bar{1}$0) texture, or a mixture of these textures. The texture can be throughout the ingot derived preform and/or on the surface. Preferably, the texture is uniform, but it is not necessary. Also, preferably, but not necessary, the cubic metal textures can be without any textural banding. For instance, the ingot derived preform can be substantially void of (100) textural banding.

In the present invention, the ingot derived preform is subjected to rotary axial forging. This rotary axial forging may also be known as orbital forging. Preferably, the rotary axial forging is done in association with a closed die. Any rotary axial forging machine can be used. Examples include, but are not limited to, rotary axial forging machines commercially available from VSI Automation, Auburn Hills, Mich. (VSI OFP-100), Wagner Banning, Dortmund, Germany (AGW-125 or AGW-400), Schmid Corporation, Switzerland (Model T630 or T200) In addition, rotary axial forging machines are further described in U.S. Pat. Nos. 4,313,332; 4,795,333; and 5,531,088, which are all incorporated in their entirety by reference herein. Also, various aspects of rotary or axial forging are further described in "Past Developments and Future Trends in the Rotary or Orbital Forging Process," Shivpuri, R., J. Mater. Shaping Technol. 6, (1) 1988, PP. 55-71; "The Push Toward Orbital Forging," Honegger, H. R., Am. Mach. 126, (11) November 1982, pp. 142-144; "Orbial Forging of Heavy Metal EFP Liners," Faccini, E. C., Conference Proceedings; "High Strain Rate Behavior of Refractory Metals and Alloys, TMS, Warrendale, Pa., 111 (1992); "Metallurgical Aspectis of Rotary Metal Forming," Standring, P. M.; Moon, J. R., "Rotary Metalworking Processes," 1979, PP. 157-170, IFS (Conferences) Ltd and University of Nottingham, November 1979; "Recent development and applications of three-dimensional finite element modeling in bulk forming processes," J. Mater. Process. Technol., Vol. 113 No. 1-3 2001/June PP. 40-45; "Load-Deformation Relationships during Upsetting by Rotary Froging", R. E. Little and R. Beyer, "Rotary Metalworking Processes," 1979, pp. 157-170, IFS (Conferences) Ltd and University of Nottingham, November 1979; "Deformation Characteristics of Cylindrical Billet in Upsetting by a Rotary Forging Machine", K. Kubo and Y. Hirai, "Rotary Metalworking Processes," 1979, pp. 157-170, IFS (Conferences) Ltd and University of Nottingham, November 1979; "Orbital Forging", J. R. Maicki, Metallurgia and Metal Forming, June, 1977, pp. 265-269, wherein all of these references are also incorporated in their entirety by reference herein.

With respect to the operation of the rotary axial forging, the amount of pressure or force applied by the rotary axial forging can be from about 50 tons to about 700 tons (or more) and more preferably from about 200 to 630 tons. Generally, the ingot derived preform is rotating at a speed of from about 30 rpm to about 120 rpm (or more) and more preferably from about 50 rpm to about 80 rpm during the orbital forging step. The rotary axial forging machine having an upper platen, which is the platen that actually contacts the ingot derived preform while the forging operation, preferably, rotates at a speed of from 30 rpm to about 300 rpm and more preferably from about 100 rpm to about 240 rpm during the orbital forging. Generally, during the forging step, the temperature of the ingot derived preform is at a temperature of from about −196 to about 1000° C., and more preferably from about 20° C. to about 350° C.

The contact area of the die to the billet and the yield strength of the material to be forged are factors in determining the size of the rotary forging machine required for manufacturing the sputtering target. The contact area in orbital forging can be calculated using the equation: $A=\pi R^2 (0.48 \, h/(2 \, R \tan(\alpha))^{0.63}$ where A is the contact area, R is the radius of the billet, h is the depth of feed/revolution and $\alpha$ is the tilt angle between the upper die and the billet plane. The force (F) required from the rotary forging press to form a sputtering target of radius R is given by the equation; $F=A\,Y\,C$, where Y is the flow stress of the metal billet material and C is the constraint factor. The constraint factor multiplied by the yield strength of the material can be viewed as an effective yield strength for the rotary forging process that takes into account the frictional forces in the die.

During the rotary axial forging step, the ingot derived preform can be reduced to the desired shape and size of the sputter target in a matter of seconds such as 1 minute or less and more preferably 30 seconds or less which, needless to say, results in a great reduction in the formation time of a target.

In the rotary axial forging step, preferably, a closed die is used which is in the shape and size of the desired sputter target. Essentially, this die or mold permits the ingot derived preform to deform into the exact desired shape and size of the sputter target and results in a very low variance in the finish product with respect to the variance in diameter of the sputter target. Generally, using the present invention, the variance in the diameter around the target is 5% or less.

In addition, with rotary forging it is possible to form the sputtering target so that its shape conforms to the erosion pattern of the sputtering target. This conserves material and reduces material cost for the sputtering target.

The closed die can be made from any material such as tool steel, or similar material. Lubricants such as molybdenum disulfide or similar or other types of forging lubricant can be used to reduce friction forces during forging.

In the present invention, the ingot derived preform that is subjected to rotary axial forging can be annealed or unannealed. Preferably, the ingot derived preform is annealed. More preferably, for tantalum the ingot derived preform is annealed at a temperature of from about 900° C. to about 1200° C. for a time of from about 60 minutes to about 240 minutes, preferably in a vacuum or inert atmosphere. The ingot or metal article can be coated as well. Other temperatures and/or times can be used. Any number of anneals can be used.

The size of the ingot derived preform which is forged in the present invention is typically based on the desired finish size of the sputter target. In other words, once one knows the size of the sputter target, one can readily determine the volume of metal in that sputter target and then decide on an appropriate diameter and height of the starting ingot derived preform, such that the starting ingot derived preform has essentially the same volume as the finished sputter target. Preferably, the height of the ingot derived preform is no more than about 3 times greater than the diameter of the ingot derived preform. More preferably, the height is closer to 1.8 times or is 1.8 times the diameter of the ingot derived preform. Generally, the height is not over 3 times, though it is possible, however it is not preferred.

The final shape or size of the sputter target can be any size such as conventional sizes like 6 inches to 18 inches with a height of from about 0.125 to about 1 inch.

As an option, prior to the rotary axial forging step, the ingot derived preform can be subjected to a first thermomechanical working or deformation step. In the present invention, it is preferred that the ingot derived preform is subjected to this prior thermomechanical working, which can be in the form of any working means (preferably, other than orbital forging), such as rotary forging, hammer forging, upset forging, rolling, cross rolling, extrusion, and the like. Essentially any means to thermomechanically work the material can be used as long as the ingot derived preform is returned to a cylindrical shape for purposes of rotary axial forging. Thus, the ingot derived preform could, in one embodiment, be rolled to any geometrical shape as long as it is subsequently return to a cylindrical shape for purposes of the preferred embodiment of the present invention. The prior thermomechanical working or deformation of the ingot derived preform preferably provides improved grain size and/or improved texture in the preform. Furthermore, the prior thermomechanical working can be done to obtain a preform that has the necessary size and/or shape for purposes of being subjected to a particular rotary axial forging machine. For instance, a billet having a diameter, for instance, in the range of approximately 3 inches to approximately 14 inches can be subjected to a first thermomechanical working, such as forging, to reduce the diameter by at least 5% and more preferably at least 50% and even more preferably at least 100% of the original starting diameter. This deformation and reduction in size can be even greater than 100% if desired. The working of the preform can be cold or hot working or combinations thereof. The billet can be worked again to restore the original diameter.

For purposes of the present invention, there can be more than one prior thermomechanical working prior to the rotary axial forging step. Any number of working steps prior to the rotary axial forging can be done in order to achieve any desired percent deformation or other thermomechanical working of the preform.

In another embodiment of the present invention, the rotary axial forging can occur in stages. For instance, if the rotary axial forging device does not have enough tonnage to forge the overall free form, radial displacement can be provided on the lower die so that the orbital forging can be done in multiple steps. For instance, the inner portion of the plate can be formed by orbital forging up to the tonnage limit of the machine, wherein the inner portion has a radius that is less than the final radius of the part. Thus, if one wanted to form a 13 inch diameter plate, the first 8 inches of the plate can be formed with the upper and lower dies aligned on center. Then, the outer portion of the preform can be forged in the same manner by moving the upper platen to the parts of the preform which have not previously been forged. In the alternative, or in combination, the lower platen which the preform rests upon can be moved such that it is aligned with the upper platen for forging the previously unforged area. Thus, by this method, an overall large preform which previously could not be forged in one orbital forging step can be forged by orbital forging in two or more steps which preferably occur sequentially. Thus, the die or upper platen is simply moved or the lower platen is moved in order to uniformly forge the entire preform in order to achieve the desired shape and final thickness of the material, such as in the form of a sputter target. For example, to form a 13 inch diameter plate, one can first forge the first 8 inches of the plate with the upper and lower dies aligned on center. The outer portion of the billet or preform would then be unformed with the inner eight inch diameter formed to near final thickness. Then, the lower die can be translated by the radius of the first pressing, in this example, the translation rate is 4 inches. Then, the second orbital forging pressing can occur to form the outer diameter portion. This pressing forms that outer portion to the final 13 inch diameter. This two step method reduces the maximum force required for orbital forging. This multiple step process can be repeated any number of times to form even larger diameter plates while only using the force available from the orbital forging press that is being used. Numerous advantages are provided by this multi-step method. In the alternative, one can press radially inward starting at the outer diameter portion and move inwards or one can first press radially starting at the inner diameter and move outwards in one or more steps.

After the rotary axial forging step, any number of other conventional steps can be preformed on the sputter target. For instance, the sputter target can then be annealed any number of times using similar annealing parameters as described above for the optional annealing step.

Also, the sputter target can optionally be subjected to any further thermomechanical working steps, such as a rolling step, flattening step, or other thermomechanical working such as drawing, hydroforming, superplastic forming, spinning or flow forming or any combination of thermomechanical workings.

Also, the sputter target can optionally be subjected to machining, grinding, lapping, milling or polishing in order to obtain desired specifications.

Once the desired sputter target is obtained, the sputter target can then be affixed to a backing layer or plate to complete the target assembly. The affixing of the sputter target to the backing plate can be done by any attachment means such as diffusion bonding, friction brazing, friction welding, explosion bonding, soldering, and the like. As an option, at least one interlayer can be located between the sputter target and backing layer and the interlayer can be affixed to the target or to the backing plate or both prior to affixing the target assembly together. The backing plate can be any conventional material such as copper, aluminum, titanium, or alloys thereof.

As indicated, at least one surface of the sputter target can be machined to desired properties and tolerances.

With respect to the sputter target obtained in the present invention, in one embodiment, the sputter target preferably has a grain size pattern that is a continuous radial-circumferential pattern which is around the center of the target. Thus, the grain size pattern is unique with respect to the fact that it is circular around the center of the target but also radiates out to the outer diameter of the target. Essentially, the grain size pattern is a blending of a radial pattern with a circumferential pattern. The sputter target, in one embodiment of the present invention, with this unique blending of grain size pattern, provides unique properties with respect to uniform sputtering especially since the circular pattern can better match the circular pattern of the magnets in sputtering equipment. Thus, the sputter target not only provides a more uniform thin film on a substrate but also the sputter target sputters or erodes uniformly which provides a more efficient and complete use of the sputter target. Similarly, the sputter target, in the same embodiment or a separate embodiment can have a crystal structure pattern that is a continuous radial-circumferential pattern. This crystal structure, as indicated above, can have any texture. Again, this preferred continuous radial-circumferential pattern in texture provides a more uniform target which leads to, in preferred embodiments, uniform erosion as well as the formation of a uniform thin film on the desired substrate.

For purposes of the present invention, the sputter target resulting from the methods of the present invention can have the same or different texture and/or grain size as the starting ingot derived preform. Thus, with respect to the grain sizes and texture and purities specified above with respect to the preform, these parameters can equally be present in the finished sputter target.

In one embodiment of the present invention, the sputter target has desirable metallographic structure. For instance, the crystallographic texture of the target can be a transitional primary texture through the thickness of the target. For example, one end of the target (for instance, the top side portion of the target) can have a primary texture of (110) and the other end of the target (e.g., the lower side portion of the target) can have a primary texture of (111). This shifting of primary textures through the thickness of the target can be very beneficial for sputtering purposes. Another way of describing the beneficial attributes of this embodiment is that the target has texture gradients through the thickness of the target wherein a stronger texture is present at certain locations of the target. The transitional primary texture or texture gradient is very beneficial in sputtering in order to compensate for a variation in sputter rate as the target erodes. The process of the present invention produces a unique texture that has not been observed in other metal working processes. In at least one embodiment of the present invention, the present invention produces a near linear texture gradient through the thickness of the target or metal article which can be used to compensate for natural variations in sputter rate that occurs with creation of a sputter erosion track in the sputtering target. The sputtering rate in a target tends to decrease with sputtering time at constant power because as the target sputters, the surface area of the target increases. This increased sputter area results in a reduced effect of applied power per unit area, which causes a reduction in the effective sputter rate. This effect is usually compensated for by gradually increasing the power applied to the sputtering target as it erodes. In the present invention, by introducing a controlled texture gradient or transitional primary texture in the sputtering target, the sputtering target can be shifted from a high sputtering rate texture, such as a (111) to a higher sputtering rate orientation, such as a (110) to compensate for the lower effective power density. Examples of this texture gradient are further shown in the examples, including FIGS. 6-8.

For purposes of the present invention, the transitional primary texture can be any shifting of primary texture. For instance, and with reference to the overall thickness of the target, one part of the sputter target, such as the upper part or lower part, more particularly, for instance, the upper half or lower half of the target can be a primary texture (e.g., a texture that is over 50% of overall texture or the highest % of texture present amongst all textures) such as (111), (100), (110), or a mixture of two or more of these textures. The other portion of the target or metal article is a different primary texture. Thus, as an example, one portion of the target can have a primary (111) texture and the other portion of the target can have a primary (100) texture. In another embodiment, one portion of the target can have a primary (111) texture and the other portion of the target can have a primary (110) texture. In another embodiment of the present invention, one portion of the target can have a primary (100) texture and the other portion of the target can have a primary (110) texture. In a further embodiment of the present invention, one part of the target can have a primary (100) texture and the other part of the target can have a primary (111) texture. Essentially, any combination of shifting primary textures can be achieved. The "portion" or "part" containing the respective primary texture can be from 10% to 90% of the overall top/bottom thickness of the target or metal article and more preferably is from 25% to 75% or from 35% to 60% of the overall thickness. For instance, in a 14 mm thick target, the first 5-6 mm of thickness, starting at the top, can be a primary (111) which is about 40% of thickness, and remaining thickness can be a primary (110). Furthermore, in another embodiment of the present invention, the texture can shift from a primary texture to a mixed texture. For instance, one portion of the target can have a primary (111) texture and the other portion can have a mixed (111):(100) texture or a mixed (110):(100) texture, and the like. Preferably, the texture that is initially exposed to sputtering is a texture which has a lower sputtering rate texture than the portion of the target that is sputtered afterwards which preferably has a higher sputtering rate. As further examples, the texture gradient of the target or metal article can have a (111) plane or (111) texture ranging from −1%/mm to −10%/mm or more. Other examples of suitable texture gradients can include for the (111) plane or (111) texture of from −2.5%/mm to −5.0/mm. This negative texture gradient means that the minus sign indicates that the (111) texture is more predominant or primary in the upper thicknesses of the target and that the predominates of the (111) texture diminishes in a linear or near linear type fashion as the texture is measured through the depth in millimeters of the target. Thus, a −2.0%/mm would mean that the (111) texture will decrease on average, about 2% per millimeter of thickness of target and thus, if the target is 14 millimeters thick, the (111) texture decreases about 24% from the top of the surface to the very bottom of the surface of the same target. Similarly, a texture gradient can exist in the same target for a (110) texture wherein the texture gradient starting from the same upper surface is 1%/mm to 10%/mm, meaning that the texture will initially be lower in the upper surface of the target and will gradually increase in a linear or near linear fashion throughout the target until the bottom of the target is reached. Other texture gradients for the (110) can include from about 1%/mm to about 7%/mm or from about 1%/mm to about 5%/mm, or from about 1% to about 4%/mm through the thickness of the target or metal article. Similar gradients can exist for the (100) texture. For other crystallographic orientation, such as in FCC metals, a similar shifting of orientations for various textures can be achieved. The present invention relates to at least one texture that exists in a target or metal article that has a texture gradient which can be in a linear or near linear fashion wherein near linear generally means that the texture will generally increase or generally decrease throughout the thickness of the target in a consistent manner within error such as within 10% or within 25% of the linear relationship.

The various texture gradients described above with respect to (111) can equally apply to (100) or (110). Similarly, the texture gradient provided for (111) described above can equally apply to (110) or (100). In one embodiment, which can apply to the texture gradients given by example above with respect to (111) and (100), the (100) texture gradient can be about 0%/mm to about 5%/mm, and other ranges include from about 0.5%/mm to about 3%/mm, or from about 0.5%/mm to about 2%/mm through the thickness of the target. The lower the texture gradient generally means that the texture is staying substantially the same throughout the thickness. In one embodiment of the present invention, the (100) texture gradient is low, such as below 3%/mm which reflects that the (100) texture is generally about the same throughout the thickness of the target. Again, this low texture gradient can equally apply to (111) or (110) depending on the type of texture gradients desired in the targets. In one preferred embodiment of the present invention, the texture gradient for the (111) texture is a negative texture gradient and the (110) texture gradient is a positive texture gradient and the (100) texture gradient is a near 0 texture gradient such as 3%/mm or less. In another embodiment of the present invention, the target or metal article can have at least one positive texture gradient for one or more textures and/or at least one negative texture for one or more textures, and/or a 0 or near 0 texture gradient for one or more textures. Any of the various combination of texture gradients or transitional primary textures can exist along with a grain size variation through the thickness which is very low such as an average grain size throughout the thickness of the target that does not vary beyond +/−50 microns and more preferably does not vary +/−25 microns throughout the thickness of the target. In other words, if the average grain size as measured at 2 mm depth is about 25 microns, the average grain size throughout the depth of the target will not exceed 75 microns and will preferably not exceed 50 microns in average grain size. This consistent average grain size range throughout the thickness of the target is also beneficial from a uniform sputter rate and film thickness formation point of view. One example of the small grain size variation is shown in FIG. 9 in the examples.

Furthermore, in one embodiment, the sputter target preferably has a variation in diameter of 5% or less (e.g., 4%, 3%, 2%, or 1% or less). This control in variance is highly desirable with respect to uniform sputtering and complete erosion of the sputter target.

Figure 1B:
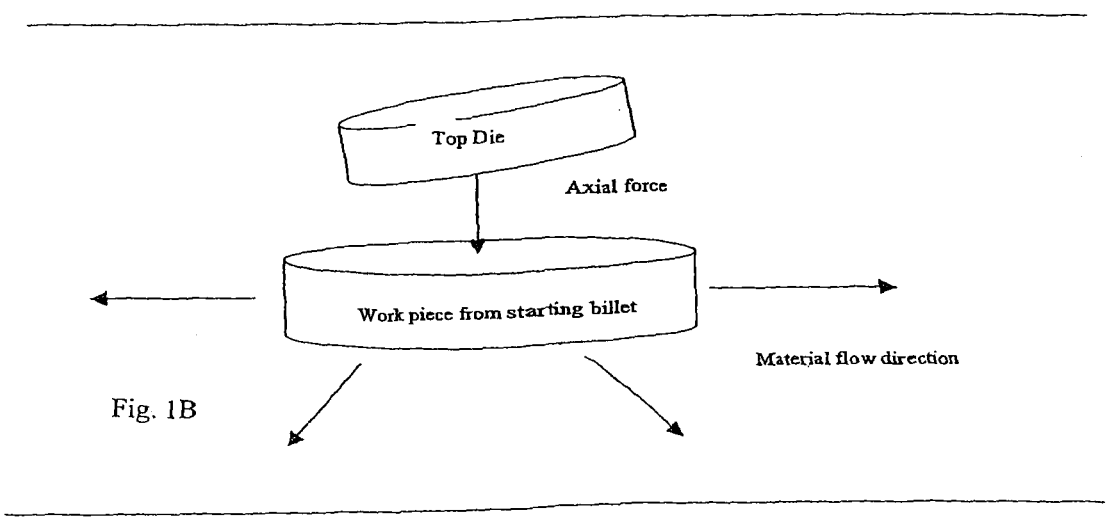
Figure 1C:
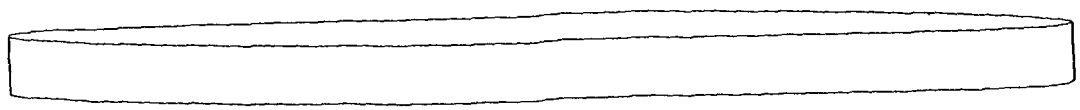
Figure 2A:
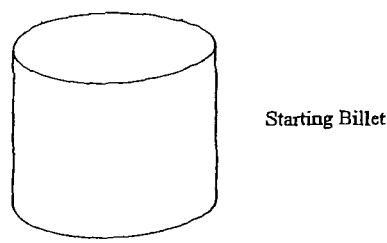
FIGS. 2 (A)-(C) is a side exploded view of the rotary axial forging of a starting billet using a bottom die.
Figure 2B:
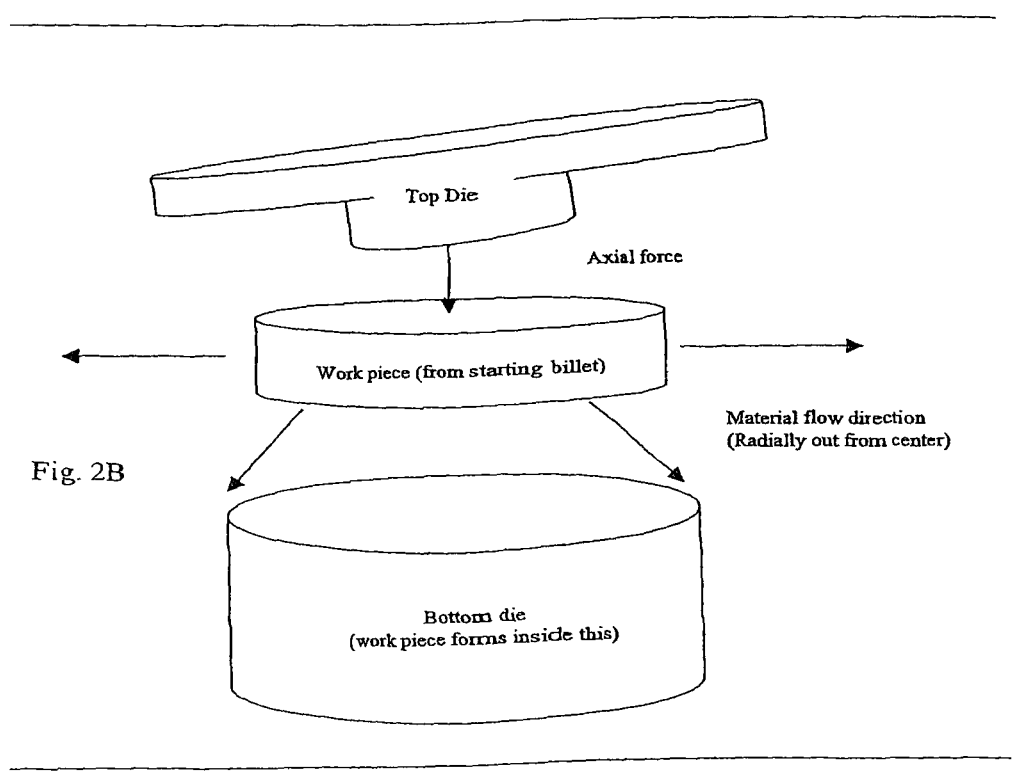
Figure 2C:

With respect to the Figures, FIG. 1 sets forth an example of the process of the present invention wherein a starting billet, shown in FIG. 1A, is subjected to a rotary axial forging. The top die is applied to the starting billet as an axial force to cause the flow of the metal material in order to form the desired diameter of the sputter target, as shown in FIGS. 1B and 1C. FIG. 2A shows in this embodiment a starting billet which is subjected to a top die form having a different type of design. Axial forces are applied to the starting billet to cause the material flow of the metal. The starting billet or work piece is at least partially located in a bottom die in order to control the final configuration of the finished target which is shown in FIG. 2C. FIG. 3 shows a flow diagram of one embodiment wherein a starting billet is subjected to a prior forging step to reduce the diameter and then subjected to a second forging step to increase the diameter. Then, the work piece or preform is subjected to a rotary axial forging step to increase the diameter to 18.5 inches. Afterwards, this piece which is essentially in the shape of the desired sputter target is then subjected to a vacuum anneal and can be attached to a backing plate and then subjected to final processing steps including final machining. FIG. 4 shows the Electron Backscattered Diffraction map of the cross-section of an orbitally forged tantalum plate after annealing at 1050 C. In this presentation grains with (111) planes parallel to the target plane are colored blue (darkest colored regions in Figure), grains with (110) planes parallel to the target plane are colored green (lightest colored regions in Figure) and grains with their (100) planes parallel to the target plane are colored red (essentially only present in {111} Pole figure as two spots). The texture gradient through the target is easily seen. FIG. 5 provides the EBSD pole figure for this material.

The present invention will be further clarified by the following examples, which are intended to be exemplary of the present invention.

EXAMPLE

Table 1 summarizes the experimental conditions used for rotary forging high purity tantalum for use in the manufacture of sputtering targets. The experimental conditions were used to produce tantalum plates of approximately 11 inches in diameter. For commercial sputtering targets, tantalum blanks with 13 to 18 inches in diameter are useful. The calculations of the force required for these larger diameter plates is provided at the bottom of Table 1. In Table 1, Sample 1A, 1B, 2A, and 2B were annealed prior to orbital forging for 1050 deg C. in vacuum for 2 hours soak. Samples 1A and 1B were extruded prior to annealing, going from a 11 inch ingot to a 3.54 inch billet and 5.9 inches long. Samples 3A and 3B were also extruded as in 1A, but with no annealing. Samples 2A and 2B were rotary forged going from a 11 inch ingot to a 3.54 inch billet and 5.9 inches long and annealed as discussed after rotary forging. Samples 4A and 4B were also rotary forged but no annealing.

TABLE 1

Orbital Forging Experimental Conditions

| Rotary Forge: | AWG-160 | Tantalum Yield Strength (kpsi) | 30 |
|---|---|---|---|
| Die Angle (deg) | 10 | Billet Diameter (in) | 3.6 |
| Rotation Rate (rpm) | 240 | Billet Height (in) | 6 |
| | | Plate radius after forging (in) | 5.43 |

| | Sample No. | | | | | | | |
|---|---|---|---|---|---|---|---|---|
| | 1A | 1B | 2A | 2B | 3A | 3B | 4A | 4B |
| Feed/Rotation (in/rev) | 0.108 | 0.108 | 0.054 | 0.163 | 0.163 | 0.054 | 0.108 | 0.244 |
| Applied Force (ton) | 144 | 144 | 155 | 155 | 159 | 164 | 184 | 187 |
| Billet Temp (C.) | 297 | 335 | 305 | 305 | 339 | 290 | 300 | 320 |
| Upper Die Temp (C.) | — | 150 | 150 | 150 | 140 | 120 | 130 | 130 |
| Lower Die Temp (C.) | — | 90 | 100 | 89 | 100 | 100 | 113 | 120 |
| Calculated Contact Area (in2) | 3.2 | 3.2 | 1.6 | 4.9 | 4.9 | 1.6 | 3.2 | 7.3 |
| Effective Yield Strength (kpsi) | 89 | 89 | 191 | 63 | 65 | 202 | 114 | 51 |
| 13 in Dia Contact Area (in2) | 4.2 | 4.2 | 2.1 | 6.3 | 6.3 | 2.1 | 4.2 | 9.4 |
| 13 in Dia Force (tons) | 185 | 185 | 199 | 199 | 205 | 211 | 237 | 241 |
| 18 in Dia Contact Area (in2) | 6.6 | 6.6 | 3.3 | 9.9 | 9.9 | 3.3 | 6.6 | 14.9 |
| 18 in Dia Force (tons) | 292 | 292 | 314 | 314 | 323 | 333 | 373 | 379 |

One of the tantalum sputtering targets fabricated by rotary closed die forging was analyzed for metallographic structure. This material, designated as sample 2B in Table 1, had an average grain size of 36 μm and was uniform within 10 μm from the top to bottom of the 0.5 inch thick plate. The crystallographic texture of this plate averaged around 45% (111), 20% (110) and 35% (100). The (111) crystallographic texture near the plate bottom was near 80% and decreased to near 20% near the top surface of the plate. This texture gradient can be used to take advantage in the design of sputtering targets by using the texture gradient to compensate for the normal reduction in sputtering rate that occurs with the continued erosion of the sputtering target. By placing the higher sputtering rate texture in the target toward the back surface of the target, the normal reduction in sputtering rate can be reduced.

FIG. 6 provides the crystallographic texture gradient found in orbital forged tantalum plate. Texture gradients for the (111) planes range from −3.8%/mm to −4.9%/mm in this data set. The high % (111) in the left side of the graph occurs on the tantalum sample side that is adjacent to the lower die where the tantalum billet and the die are not moving relative to each other. The low % (111) on the right side of the graph corresponds to the sample face that is in contact with the rotating die and is experiencing high shear.

FIG. 7 provides a similar series of curves for the % (110) crystallographic texture. In this case, the % (110) texture gradually increases as one goes from the left to right side corresponding to moving from the stationary lower die contact surface to the upper rotating die contact surface in the tantalum plate. In this case the texture gradients range from 1%/mm to 4.1%/mm as one moves from the stationary die contact surface to the rotating die contact surface.

FIG. 8 provides the through thickness texture variation for the % (100) texture component for orbital forged tantalum plate. The % (100) texture gradient ranged from 3%/mm to 0.7%/mm. The gradient in the (100) component tends to be less than the gradients in the (111) and (100) component.

The grain size variation through thickness in orbital forged tantalum plate is provided in FIG. 9. The grain size shows only a slight gradient through thickness in the orbital forged tantalum. Average grain size ranges from 25 to 50 μm with the grain size slightly larger in the material near the lower die that is stationary relative to the tantalum billet.

Table 2 provides a summary of the measured texture gradients and grain size for the four tantalum samples described in this application.

TABLE 2

| | % (111) | | % (100) | | % (110) | | |
|---|---|---|---|---|---|---|---|
| Trial | Slope (%/mm) | Intercept (%) | Slope (%/mm) | Intercept (%) | Slope (%/mm) | Intercept (%) | Avg GS (um) |
| 1 | −3.8 | 85 | 2.1 | 17 | 1.7 | −2 | 27 |
| 2 | −4 | 75 | 3 | 18 | 1 | 6 | 28.9 |
| 3 | −4.8 | 72 | 0.7 | 33 | 4.1 | −4 | 48.6 |
| 4 | −4.9 | 72 | 2.2 | 23 | 2.6 | 5 | 38.1 |

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of forming a sputter target comprising rotary axial forging of an ingot derived preform to the shape and size of said sputter target.

2. The method of claim 1, wherein said ingot derived preform is a valve metal or refractory metal.

3. The method of claim 1, wherein said ingot derived preform is a tantalum preform or alloy thereof.

4. The method of claim 1, wherein said ingot derived preform is a titanium preform or alloy thereof.

5. The method of claim 1, wherein said ingot derived preform is a niobium preform or alloy thereof.

6. The method of claim 1, wherein said ingot derived preform is a cobalt, copper, aluminum, gold, or silver preform, or alloys thereof.

7. The method of claim 1, wherein said ingot derived preform comprises tantalum, niobium, titanium, combinations thereof, or alloys thereof.

8. The method of claim 1, further comprising thermomechanically working said ingot derived preform prior to said rotary axial forging.

9. The method of claim 1, further comprising reducing the diameter of said ingot derived preform by working of said preform prior to said rotary axial forging.

10. The method of claim 9, wherein said reducing in diameter is achieved by forging, rolling, or combinations thereof.

11. The method of claim 9, wherein said ingot derived preform is reduced in diameter by at least 5%.

12. The method of claim 1, wherein said ingot derived preform is annealed prior to said rotary axial forging.

13. The method of claim 1, further comprising annealing said ingot derived preform at a temperature of from about 900° C. to about 1200° C. for a time of from about 60 minutes to about 240 minutes prior to said rotary axial forging step.

14. The method of claim 1, wherein said rotary axial forging is achieved by rotating the ingot derived preform at a speed of from about 30 rpms to about 300 rpms and wherein said rotary axial forging has an upper platen which rotates at a speed of 30 rpms to about 300 rpms during said rotary axial forging step.

15. The method of claim 1, wherein said ingot derived preform is a billet, rod, or cylinder.

16. The method of claim 1, wherein said shape and size of said sputter target is not the finished shape and size of a sputter target and wherein said method further comprises subjecting said sputter target to further thermomechanical working in order to obtain the desired shape and size of a finished sputter target.

17. The method of claim 1, wherein said method further comprises machining at least one surface of said sputter target.

18. The method of claim 1, further comprising affixing said sputter target to a backing plate.

19. The method of claim 1, further comprising affixing at least one interlayer to said sputter target or to said backing plate, or both and then affixing said target, plate, and interlayer together to form a target assembly.

20. The method of claim 1, further comprising rolling, flattening, milling, grinding, lapping, polishing, or combinations thereof to said ingot derived preform or to said sputter target or to both.

21. The method of claim 1, wherein said ingot derived preform is cylindrical in shape and has a height that is no more than 3 times the diameter.

22. The method of claim 1, wherein said ingot derived preform is reduced in diameter by at least 10%.

23. The method of claim 1, wherein said rotary axial forging occurs in a closed die.

24. The method of claim 23, wherein said closed die is in the shape of the sputter target.

25. The method of claim 1, wherein said sputter target has an average grain size of from about 20 to about 100 µm.

26. The method of claim 25, wherein the sputter target comprises aluminum, copper, tantalum, niobium, titanium, platinum, gold, nickel, iron, vanadium, molybdenum, tungsten, silver, palladium, iridium, zirconium, hafnium or alloys thereof, or combinations thereof.

27. The method of claim 25, wherein said sputter target is tantalum with purity of at least 99.99%.

28. The method of claim 25, wherein said sputter target is tantalum with an average crystallographic texture that is primary (111).

29. The method of claim 25, wherein said sputter target is tantalum with an average crystallographic texture that is primary (110).

30. The method of claim 1, wherein said rotary axial forging occurs in two or more forging steps of the ingot derived preform.

* * * * *